US012584873B2

(12) United States Patent
Yoshii et al.

(10) Patent No.: US 12,584,873 B2
(45) Date of Patent: Mar. 24, 2026

(54) MEASUREMENT DEVICE AND MEASUREMENT METHOD

(71) Applicants:SUMIDA CORPORATION, Tokyo (JP); Kyoto University, Kyoto (JP)

(72) Inventors: Yoshiharu Yoshii, Miyagi (JP); Norikazu Mizuochi, Kyoto (JP); Yuki Takemura, Kyoto (JP)

(73) Assignees: SUMIDA CORPORATION (JP); Kyoto University (JP)

( * ) Notice: Subject to any disclaimer, the term of this patent is extended or adjusted under 35 U.S.C. 154(b) by 167 days.

(21) Appl. No.: 18/701,719

(22) PCT Filed: Sep. 20, 2022

(86) PCT No.: PCT/JP2022/034969
§ 371 (c)(1),
(2) Date: Apr. 16, 2024

(87) PCT Pub. No.: WO2023/089944
PCT Pub. Date: May 25, 2023

(65) Prior Publication Data
US 2024/0410843 A1 Dec. 12, 2024

(30) Foreign Application Priority Data
Nov. 19, 2021 (JP) ................................. 2021-188931

(51) Int. Cl.
*G01N 24/00* (2006.01)
*G01N 21/64* (2006.01)
*G01R 33/26* (2006.01)
(52) U.S. Cl.
CPC ....... *G01N 24/006* (2013.01); *G01N 21/6402* (2013.01); *G01R 33/26* (2013.01)

(58) Field of Classification Search
CPC ........ G01R 33/20; G01R 33/24; G01R 33/26; G01R 33/28; G01R 33/32; G01R 33/323;
(Continued)

(56) References Cited

U.S. PATENT DOCUMENTS

| | | | |
|---|---|---|---|
| 2017/0336482 A1* | 11/2017 | Hwang | ................... G01N 24/10 |
| 2017/0343695 A1* | 11/2017 | Stetson | ................... G01V 3/101 |

(Continued)

FOREIGN PATENT DOCUMENTS

| | | |
|---|---|---|
| EP | 2784521 A1 | 10/2014 |
| JP | 2004-274426 A | 9/2004 |

(Continued)

OTHER PUBLICATIONS

International Search Report of the International Searching Authority issued in PCT/JP2022/034969, mailed Oct. 25, 2022; ISA/JP (5 pages).

*Primary Examiner* — Huy Q Phan
*Assistant Examiner* — David B Frederiksen
(74) *Attorney, Agent, or Firm* — Harness, Dickey & Pierce, P.L.C.

(57) ABSTRACT

A light receiving device receives fluorescence emitted by a magnetic resonance member in response to excitation light and generates a fluorescence sensor signal corresponding to a fluorescence intensity. A CMR arithmetic part performs common mode rejection with respect to the fluorescence sensor signal based on a reference light sensor signal of reference light that is obtained by branching the excitation light in consideration of nonlinearity of a level of the fluorescence sensor signal corresponding to an amount of the excitation light and generates a CMR signal. An A/D converter digitizes the CMR signal. An analog/digital converter digitizes the reference light sensor signal. An arithmetic processing device derives a measurement value of a
(Continued)

measured field based on the digitized CMR signal and the digitized reference light sensor signal.

7 Claims, 6 Drawing Sheets

(58) Field of Classification Search
CPC ........ G01R 33/34; G01R 33/44; G01R 33/48;
G01N 21/62; G01N 21/63; G01N 21/64;
G01N 21/6402; G01N 24/006
See application file for complete search history.

(56) References Cited

U.S. PATENT DOCUMENTS

2018/0203080 A1 *  7/2018  Acosta .................... C30B 33/12
2018/0267114 A1    9/2018  Settles et al.

FOREIGN PATENT DOCUMENTS

JP      2006-038765  A    2/2006
JP      2019-138772  A    8/2019
WO      2020/157497  A1   8/2020

* cited by examiner

MEASUREMENT DEVICE AND MEASUREMENT METHOD

CROSS REFERENCE TO RELATED APPLICATIONS

This application is a 371 U.S. National Phase of International Application No. PCT/JP2022/034969, filed on Sep. 20, 2022, which claims priority to Japanese Patent Application No. 2021-188931, filed Nov. 19, 2021. The entire disclosures of the above applications are incorporated herein by reference.

BACKGROUND

Technical Field

The present invention relates to a measurement device and a measurement method.

Related Art

A magnetic field measurement device performs magnetic measurement using optically detected magnetic resonance (ODMR) in which electron spin resonance of a sensing member such as a diamond structure having nitrogen and lattice defects (NV center: Nitrogen Vacancy Center) is utilized. In the ODMR, a static magnetic field is applied to a magnetic resonance member such as diamond that has the NV center in separation from a measured magnetic field, and at the same time, laser light (excitation light for initialization and measurement) and a microwave are applied in a predetermined sequence. An amount of light of fluorescence emitted from the magnetic resonance member is detected and a magnetic flux density of the measured magnetic field is derived based on the amount of light.

For instance, in Ramsey pulse sequence, (a) excitation light is irradiated to an NV center, (b) a first $\pi/2$ pulse of a microwave is applied to the NV center, (c) a second $\pi/2$ pulse of the microwave is applied to the NV center at a predetermined time interval $\pi$ from the first $\pi/2$ pulse, (d) a light emission amount from the NV center is measured by irradiating the excitation light to the NV center, and (e) a magnetic flux density is derived based on the measured light emission amount. Further, in a spin echo pulse sequence, (a) the excitation light is irradiated to the NV center, (b) the first $\pi/2$ pulse of the microwave is applied to the NV center at a phase of 0 degrees of a measured magnetic field, (c) a $\pi$ pulse of the microwave is applied to the NV center at a phase of 180 degrees of the measured magnetic field, (d) the second $\pi/2$ pulse of the microwaves is applied to the NV center at a phase of 360 degrees of the measured magnetic field, (e) the excitation light is irradiated to the NV center and the light emission amount from the NV center is measured by irradiating the excitation light to the NV center, and (f) the magnetic flux density is derived based on the measured light emission amount.

A certain sensor device measures a magnetic field by nuclear magnetic resonance using a diamond sensor including the NV center as mentioned above (for instance, refer to Patent Document 1).

PRIOR ART DOCUMENT

Patent Document

Patent Document 1: Japanese Patent Publication Number 2019-138772.

In optically detected magnetic resonance that utilizes electron spin resonance of a sensing member, because a detection signal obtained from fluorescence is weak, it is susceptible to noise. In particular, measurement accuracy would decrease due to noise in irradiation light (laser light).

An object of the present invention is to obtain a measurement device and a measurement method that suppress a noise component caused by irradiation light and improve measurement accuracy.

SUMMARY

A measurement device according to the present invention has a magnetic resonance member, a high frequency magnetic field generator, a light emitting device, a fluorescence light receiving device, a CMR arithmetic part, a first analog/digital converter, a second analog/digital converter, and an arithmetic processing device. Specifically, with respect to the magnetic resonance member, an electron spin quantum state changes in response to a field to be measured (a measured field) and an electron spin quantum operation is performed by using a microwave. The high frequency magnetic field generator performs the electron spin quantum operation of the magnetic resonance member by using the microwave. The light emitting device emits excitation light irradiate to the magnetic resonance member. The fluorescence light receiving device receives fluorescence emitted by the magnetic resonance member in response to the excitation light and generates a fluorescence sensor signal corresponding to an intensity of the fluorescence. The CMR arithmetic part performs common mode rejection with respect to the fluorescence sensor signal based on a reference light sensor signal and generates a CMR signal based on the common mode rejection. The reference light sensor signal is generated by receiving reference light. The reference light is obtained by branching the excitation light. The first analog/digital converter digitizes the CMR signal. The second analog/digital converter digitizes the reference light sensor signal that is generated by receiving the reference light. The reference light is obtained by branching the excitation light. The arithmetic processing device generates a detection signal based on the digitized CMR signal and the digitized reference light sensor signal and derives a measurement value of the field to be measured based on the detection signal. Further, the CMR arithmetic part performs the above-mentioned common mode rejection in consideration of nonlinearity of a level of the fluorescence sensor signal corresponding to an amount of the above-mentioned excitation light. Further, the arithmetic processing device performs digital filter processing for noise removal with respect to the digitized CMR signal or the detection signal.

A measurement method according to the present invention includes (a) performing an electron spin quantum operation with respect to a magnetic resonance member by using a microwave according to a predetermined measurement sequence and emitting excitation light irradiate to the magnetic resonance member, an electron spin quantum state being changed in response to a field to be measured (a measured field) and the electron spin quantum operation being performed by using the microwave in the magnetic resonance member, (b) receiving fluorescence emitted by the magnetic resonance member in response to the excitation light and generating a fluorescence sensor signal corresponding to an intensity of the fluorescence, (c) performing common mode rejection with respect to the fluorescence sensor signal based on a reference light sensor signal in consideration of nonlinearity of a level of the fluorescence sensor signal corresponding to an amount of the excitation light and generating a CMR signal based on the common mode rejection, the reference light sensor signal being generated by receiving reference light, the reference light being obtained by branching the excitation light, (d) digitizing the CMR signal, (e) digitizing a reference light sensor signal that is generated by receiving reference light, the reference light being obtained by branching the excitation light, and (f) generating a detection signal based on the digitized CMR signal and the digitized reference light sensor signal and deriving a measurement value of the field to be measured (the measured field) based on the detection signal. Further, digital filter processing for noise removal is performed with respect to the digitized CMR signal or the detection signal.

Effects of the Invention

According to the present invention, it is possible to obtain a measurement device and a measurement method that suppress a noise component caused by irradiation light and improve measurement accuracy.

DETAILED DESCRIPTION

Embodiments of the present invention will be explained below with reference to the drawings.

Figure 1:
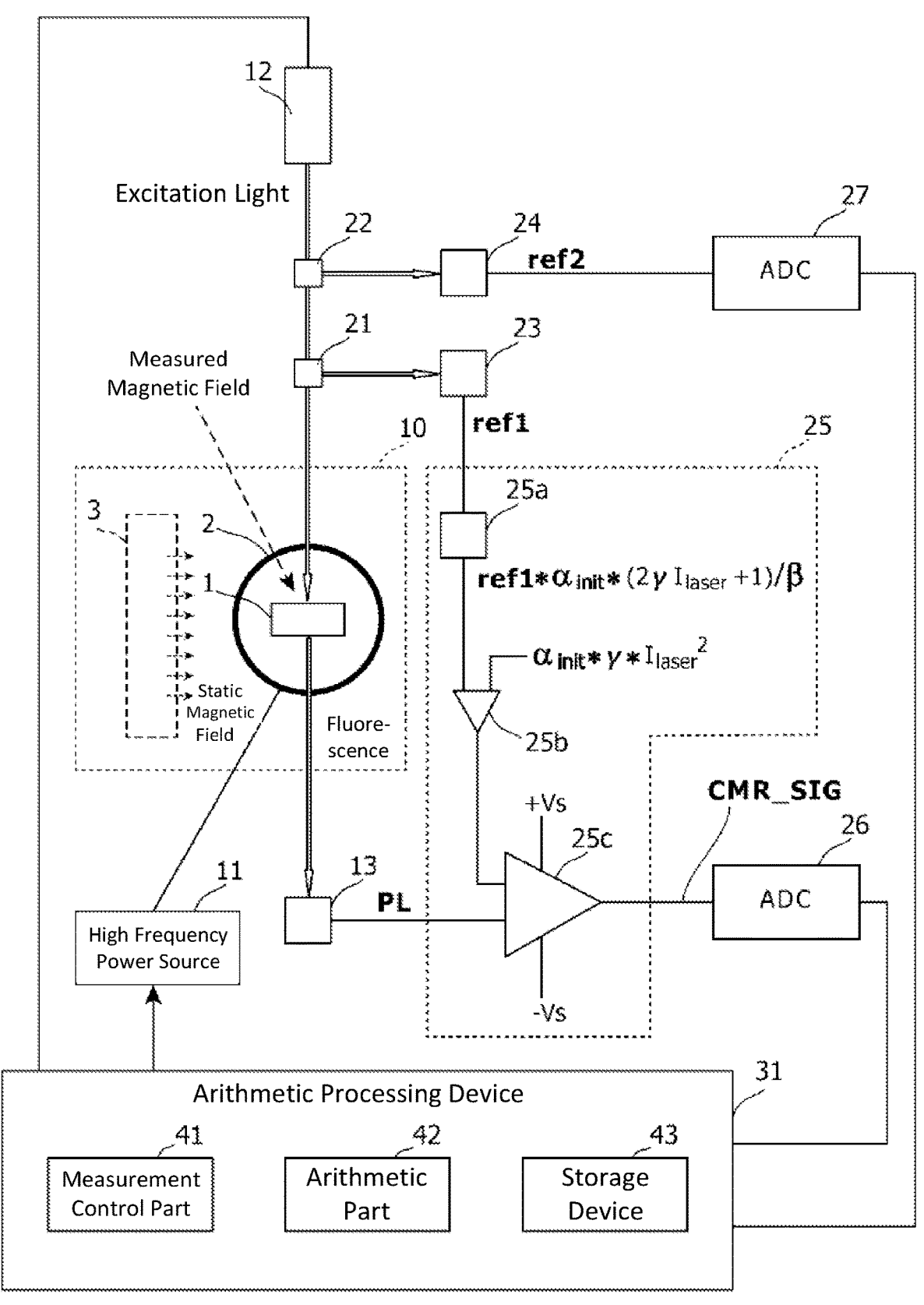
FIG. 1 is a block diagram that shows a configuration of a measurement device according to an embodiment of the present invention.

FIG. 1 is a block diagram that shows a configuration of a measurement device according to an embodiment of the present invention. The measurement device shown in FIG. 1 has a sensor part 10, a high frequency power source 11, a light emitting device 12, and a light receiving device 13.

The sensor part 10 detects a field to be measured (a measured field, for instance, a magnetic field such as an intensity and a direction of the magnetic field) at a predetermined position (for instance, on or above a surface of an object to be inspected). Further, the field to be measured (the measured field) may be an alternating current field with a single frequency, an alternating current field with a predetermined cycle having a plurality of frequency components, or a direct current field.

In this embodiment, the sensor part 10 has a magnetic resonance member 1, a high frequency magnetic field generator 2, and a magnet 3, and detects the measured field by using the ODMR.

The magnetic resonance member 1 has a crystal structure. An electron spin quantum state of the magnetic resonance member 1 changes in correspond with the measured field (here, a magnetic field), and at the same time, the magnetic resonance member 1 is a member in which it is capable of an electron spin quantum operation by a microwave at a frequency that corresponds to an arrangement direction of defects and impurities in a crystal lattice (based on Rabi oscillation). That is, the magnetic resonance member 1 is placed at the position where a magnetic field is measured.

In this embodiment, the magnetic resonance member 1 is an optically detected magnetic resonance member having a plurality (that is, an ensemble) of specific color centers. This specific color center has an energy level capable of Zeeman splitting, and at the same time, can take a plurality of directions in which shift widths of the energy level at the time of Zeeman splitting are different from each other.

Here, the magnetic resonance member 1 is a member such as a diamond that includes a plurality of NV (Nitrogen Vacancy) centers as a specific color center of a single category (or type). In the case of the NV center, a ground state is a triplet state of ms=0, +1, −1 and a level of ms=+1 and a level of ms=−1 undergo Zeeman splitting. When the NV center transitions from an excited state at the levels of ms=+1 and ms=−1 to the ground state, the NV center is accompanied by fluorescence at a predetermined proportion and the remaining proportion of the NV center transitions from the excited state (ms=+1 or ms=−1) to the ground state (ms=0) with non-radiation.

Note that the color center included in the magnetic resonance member 1 may be a color center other than the NV center.

The high frequency magnetic field generator 2 applies a microwave to the magnetic resonance member 1 so as to perform an electron spin quantum operation of the magnetic resonance member 1. For instance, the high frequency magnetic field generator 2 is a plate-shaped coil and has a substantially circular coil part that emits the microwave and terminal parts that extend from both ends of the coil part and are fixed to the substrate. The high frequency power source 11 generates a current of the microwave and is conductively connected to the high frequency magnetic field generator 2. The coil part conducts two currents that are mutually in parallel at a predetermined interval so as to sandwich the magnetic resonance member 1 at both end surface parts of the coil part and emit the above-mentioned microwave. Here, the coil part is a plate-shaped coil, however, because the current of the microwave flows through the end surface part of the coil part due to a skin effect, two currents are formed. As a result, the microwave with a spatially uniform intensity is applied to the magnetic resonance member 1.

In the case of the NV center, since the color center is formed by a defect (vacancy) (V) and nitrogen (N) as an impurity in the diamond crystal, there are four possible positions for adjacent nitrogen (N) with respect to the defect (vacancy) (V) in the diamond crystal (that is, the arrangement directions of a pair of the vacancy and the nitrogen). Sub-levels (that is, the energy level from the ground) after Zeeman splitting respectively corresponding to these arrangement directions are different from each other. Therefore, in a characteristic of a fluorescence intensity after Zeeman splitting due to a static magnetic field with respect to a frequency of the microwave, in correspond with each direction i (i=1, 2, 3, 4), four pairs of dip frequencies (fi+, fi−) that are different from one another appear. Here, the above-mentioned frequency of the microwave (wavelength) is set in correspond with any of the dip frequencies of these four pairs of dip frequencies.

Further, the magnet 3 applies a static magnetic field (a DC magnetic field) to the magnetic resonance member 1 so that the energy levels of a plurality of specific color centers (here, a plurality of NV centers) in the magnetic resonance member 1 undergo Zeeman splitting. Here, the magnet 3 is a ring-type permanent magnet, such as a ferrite magnet, an alnico magnet, or a samarium cobalt magnet.

In this embodiment, because an application direction of the above-mentioned static magnetic field is the same as an application direction of the above-mentioned measured magnetic field, by applying the above-mentioned static magnetic field, the change of the fluorescence intensity at the above-mentioned dip frequency is enhanced and the sensitivity is increased.

Further, in this embodiment, the magnetic resonance member 1 is provided with the plurality of color centers (here, the NV centers) in which it is capable of the electron spin quantum operation by the above-mentioned micro-waves. The magnet 3 applies the substantially uniform static magnetic field to a predetermined region (an irradiation region of the excitation light) of the magnetic resonance member 1. For instance, the static magnetic field is applied as a difference or a ratio between the maximum value and the minimum value of the intensities of the static magnetic field in the predetermined region is equal to or less than a predetermined value.

Further, in the magnetic resonance member 1, as the arrangement direction of the above-mentioned defects and impurities is substantially coincident with the above-mentioned direction of the static magnetic field (and the direction of the applied magnetic field), the crystal of the magnetic resonance member 1 is formed and the direction of the magnetic resonance member 1 is set.

Furthermore, in this embodiment, in order to irradiate the magnetic resonance member 1 with excitation light, an optical system from the light emitting device 12 to the magnetic resonance member 1 is provided. Further, in order to detect fluorescence from the magnetic resonance member 1, an optical system from the magnetic resonance member 1 to the light receiving device 13 is provided.

The light emitting device 12 has, such as a laser diode, as a light source and the light source emits laser light having a predetermined wavelength as excitation light to irradiate the magnetic resonance member 1. Further, the light receiving device 13 has, such as a photodiode or a phototransistor, as a light receiving element, receives the fluorescence emitted by the magnetic resonance member 1 in correspond with the excitation light, and generates a fluorescence sensor signal PL corresponding to the intensity of the fluorescence. This fluorescence is concentrated toward the light receiving device 13 by an optical system such as a compound parabolic concentrator (CPC).

Further, the measurement principle will be explained.

As expressed in the following equation, an intensity I of the excitation light mentioned above is the sum of an original intensity $I_{laser}$ and a noise component intensity (an intensity of noise) $I_{noise}$. Further, this noise component is generated due to, for instance, fluctuation in a power supply voltage of the light emitting device 12 and fluctuation in a light emission amount from the light source, and has a frequency in a range of, for instance, about kHz order to about 100 kHz order.

$$I = I_{laser} + I_{noise}.$$

Figure 2:
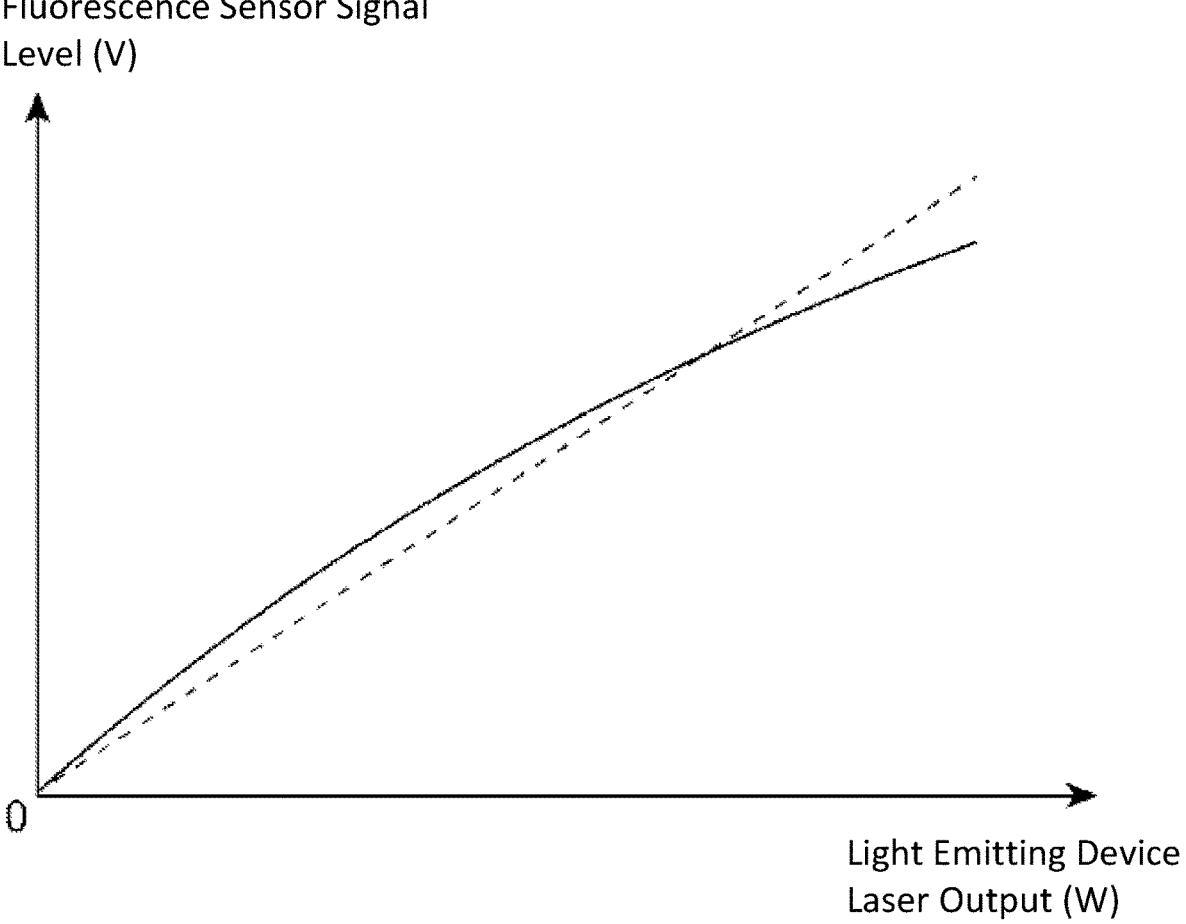
FIG. 2 is a diagram that explains nonlinearity of a level of a fluorescence sensor signal with respect to an amount of excitation light.

Further, a level of the fluorescence sensor signal PL basically increases as the intensity I of the excitation light increases. However, due to the change in the electron spin quantum state with respect to the measured field, the fluorescence intensity at the start of the excitation light irradiation during the measurement becomes low. Thereafter, until the influence of the change in the electron spin quantum state with respect to the measured field disappears, the fluorescence intensity gradually increases. Therefore, a detection signal SD that is proportional to a level variation $\alpha_{cont}(t)$ of the fluorescence sensor signal PL due to the change in the electron spin quantum state with respect to the measured field is derived as a signal indicating the measured field. The fluorescence sensor signal PL is expressed by the following equation. Here, because the fluorescence intensity is relatively low, the level of the fluorescence sensor signal PL has nonlinearity. FIG. 2 is a diagram that explains the nonlinearity of the level of the fluorescence sensor signal with respect to an amount of the excitation light. For instance, as shown in FIG. 2, the inclination of the level of the fluorescence sensor signal PL is large as the fluorescence intensity is small.

$$PL(t) = \alpha(t) \times f(I) = (\alpha_{init} + \alpha_{cont}(t)) \times I = (\alpha_{init} + \alpha_{cont}(t)) \times f$$
$$(I_{laser} + I_{noise})$$

Further, $\alpha_{init}$ is a coefficient indicating a portion (a portion that is not affected by changes in the electron spin quantum state with respect to the measured field) being proportional to the intensity I of the excitation light, and f is a function that shows the nonlinearity with respect to the intensity I of the excitation light. For instance, f is a polynomial expression of degree N (N≥2), and in this embodiment, f is a quadratic expression ($f(x) = x + \gamma \cdot x^2$, $\gamma$ is a constant). The fluorescence sensor signal PL in this case is expressed by the following equation.

Note that the function f and the constant $\gamma$ are derived in advance by, such as experiments, on a sensor of the light receiving device 13. Further, this function f may have another function form such as an exponential function.

$$PL(t) = \alpha(t) \times f(I) = (\alpha_{init} + \alpha_{cont}(t)) \times I = (\alpha_{init} + \alpha_{cont}(t)) \times \{$$
$$(I_{laser} + I_{noise}) + \gamma (I_{laser} + I_{noise})^2\} = \alpha_{init}\{(\gamma I_{laser}^2 +$$
$$I_{laser}) + (2\gamma I_{laser} + 1)I_{noise} + \gamma I_{noise}^2\} + \alpha_{cont}(t)$$
$$\{(I_{laser} + I_{noise}) + \gamma (I_{laser} + I_{noise})^2\}$$

On the other hand, because a level ref of a reference light sensor signal of reference light being branched from the excitation light is proportional to the intensity I of the excitation light, it is expressed as the following equation. Further, because the intensity of the reference light is relatively high, the level of the reference light sensor signal PL is linear (proportional) with reference to the intensity of the reference light.

$$ref = ref1 = ref2 = \beta \times I = \beta \times (I_{laser} + I_{noise}).$$

Where, $\beta$ is a constant. Note that ref1 and ref2 will be explained later.

Specifically, PL is expressed by the above equation by ignoring a cubic term and subsequent terms because of $I_{noise} \ll I_{laser}$ after Taylor expansion is performed with respect to PL. In addition, as shown below, a CMR signal CMR_SIG(t) is derived from the PL and the ref by subjecting the above PL and the ref to Taylor expansion (Maclaurin expansion) using $I_{noise}$ and approximating them while ignoring the cubic term and the subsequent terms. Note that in the following equation, PL ($I_{laser} + I_{noise}$) indicates that the PL is a function of ($I_{laser} + I_{noise}$), and PL ($I_{laser}$) is the PL when $I_{noise}$ is set to 0. Similarly, ref ($I_{laser} + I_{noise}$) indicates that the ref is a function of ($I_{laser} + I_{noise}$), and ref ($I_{laser}$) is the ref when $I_{noise}$ is set to 0. Further, PL' is a primary differential coefficient of the PL with respect to $I_{noise}$ when $I_{noise} = 0$, and ref' is a primary differential coefficient of the ref with respect to $I_{noise}$ when $I_{noise} = 0$.

$$PL(I_{laser}+I_{noise})=PL(I_{laser})+PL'(I_{laser})I_{noise}+\ \dots\ .$$

$$\text{ref}(I_{laser}+I_{noise})=\text{ref}(I_{laser})+\text{ref}'(I_{laser})I_{noise}+\ \dots\ .$$

Further, because of $I_{noise}\ll I_{laser}$, the cubic term and the subsequent terms of $I_{noise}$ can be ignored. Therefore, the above PL and ref are approximated by the following equations.

$$PL(I_{laser}+I_{noise})=PL(I_{laser})+PL'(I_{laser})I_{noise}.$$

$$\text{ref}(I_{laser}+I_{noise})=\text{ref}(I_{laser})+\text{ref}'(I_{laser})I_{noise}.$$

Further, the common mode rejection is performed on PL(t) so as to generate the CMR signal. Specifically, the CMR signal CMR_SIG(t) is derived by the following equation so that the influence of $I_{noise}$ on $\alpha_{init}$ is removed.

$$\text{CMR\_SIG}(t)=PL-(PL'(I_{laser})/\text{ref}'(I_{laser}))\text{ref}.$$

Note that, because of PL' $(I_{laser})$/ref' $(I_{laser})=\alpha_{init}(2\gamma I_{laser}+1)/\beta$, the CMR signal CMR_SIG (t) is expressed by the following equation. Further, in the following equation, a constant $\alpha_{init}\gamma I_{laser}^2$ is added in order to remove a term (explained below) that is a constant regardless of time t.

$$\text{CMR\_SIG}(t)=PL(t)-\alpha_{init}(2\gamma I_{laser}+1)/\beta\times\text{ref}(t)+$$
$$\alpha_{init}\gamma I_{laser}^2=\alpha_{cont}(t)\{(I_{laser}+I_{noise})+$$
$$\gamma(I_{laser}+I_{noise})^2\}$$

With respect to $\alpha_{init}\{(I_{laser}+I_{noise})+\gamma\ (I_{laser}+I_{noise})^2\}$ in PL (t), since the sufficiently small term $\gamma I_{noise}^2$ is ignored, $\alpha_{init}$ $\{(I_{laser}+I_{noise})+\gamma\ (I_{laser}+I_{noise})^2\}=\alpha_{init}(\gamma I_{laser}+1)\ I_{laser}+\alpha_{init}$ $(2\gamma I_{laser}+1)\ I_{noise}=\alpha_{init}(2\gamma I_{laser}+1)\times(I_{laser}+I_{noise})-\alpha_{init}\gamma I_{laser}$ is obtained.

Thereafter, the above-mentioned detection signal SD(t) is derived as shown in the following equation. As a result, the influence of $I_{noise}$ on $\alpha_{cont}$ (t) is removed.

$$SD(t)=\alpha_{cont}(t)=\text{CMR\_SIG}(t)/(\text{ref}(t)+\gamma\cdot\text{ref}(t)^2).$$

A peak value (a value at t=0) and a time integration value of the detection signal SD(t) are correlated with an intensity of the measured field. Therefore, the intensity of the measured field is derived from the peak value and the time integration value of the detection signal SD(t) by specifying a correspondence relation between the peak value and the time integral value of the detection signal SD(t) and the intensity of the measured field by such as experiments in advance and using a calculation equation or a table that shows the correspondence relation.

Based on such the measurement principle, the following configuration is provided.

The measurement device shown in FIG. 1 further has light separation parts 21 and 22 as optical elements on an optical path of the excitation light from the light emitting device 12 to the magnetic resonance member 1. The light separation parts 21 and 22 respectively branch a part of the excitation light from the excitation light and emit the part of the excitation light in a different direction as the reference light. For instance, the light separation parts 21 and 22 are deflection independent beam splitters.

Further, the measurement device shown in FIG. 1 has light receiving devices 23 and 24 that receive the reference lights and generate reference light sensor signals ref1 and ref2 (the refs mentioned above) corresponding to the intensities of the reference lights.

In this embodiment, two reference lights are separately generated from the excitation light, and two reference light sensor signals ref1 and ref2 are generated. The reference light sensor signal ref1 is used for the common mode rejection, which will be explained below. The reference light sensor signal ref2 is digitized and used to generate the detection signal SD.

Furthermore, the measurement device shown in FIG. 1 has a CMR arithmetic part 25 as an analog calculation circuit. The CMR arithmetic part 25 performs the common mode rejection with respect to the fluorescence sensor signal PL based on the reference light sensor signal ref1 and generates the CMR signal CMR_SIG based on the common mode rejection. Specifically, the CMR arithmetic part 25 has a coefficient part 25a, an offset eliminating part 25b, and a differential amplifier 25c. The coefficient part 25a multiplies the reference light sensor signal ref1 by a predetermined coefficient $\alpha_{init}$ $(2\gamma I_{laser}+1)/\beta$. The offset eliminating part 25b subtracts the constant $\alpha_{init}\gamma I_{laser}^2$ indicating the above-mentioned offset from an output signal ref1$\times\alpha_{init}$ $(2\gamma I_{laser}+1)/\beta$ of the coefficient part 25a. The differential amplifier 25c calculates a difference between the fluorescence sensor signal PL and an output signal ref1$\times\alpha_{init}$ $(2\gamma I_{laser}+1)/\beta-\alpha_{init}\gamma I_{laser}^2$ of the offset eliminating part 25b, and outputs the calculation result as the CMR signal CMR_SIG. In addition, in FIG. 1, the offset eliminating part 25b subtracts the constant $\alpha_{init}\gamma I_{laser}^2$ indicating the above-mentioned offset from the output signal ref1$\times\alpha_{init}$ $(2\gamma I_{laser}+1)/\beta$ of the coefficient part 25a. However, instead of the above, the constant $\alpha_{init}\gamma I_{laser}^2$ indicating the above-mentioned offset may be added to the fluorescence sensor signal PL, or the constant $\alpha_{init}\gamma I_{laser}^2$ indicating the above-mentioned offset may be added to the output signal of the differential amplifier 25c.

Note that the coefficient part 25a as the analog calculation circuit may be provided. Alternatively, without providing the coefficient part 25a, the reference light sensor signal, which is obtained by adjusting a gain of the light receiving device 23 and multiplying by the predetermined coefficient $\alpha_{init}$ $(2\gamma I_{laser}+1)/\beta$, may also be possible to output.

Furthermore, the measurement device shown in FIG. 1 has analog/digital converters 26 and 27 that respectively digitize the CMR signal CMR_SIG and the reference sensor signal ref2 and has an arithmetic processing device 31 that controls the measurement device and performs signal processing.

The analog/digital converters 26 and 27 respectively digitize the CMR signal CMR_SIG and the reference sensor signal ref2 with a predetermined number of bits and a predetermined sampling period (speed), and output the digitized CMR signal CMR_SIG and the digitized reference sensor signal ref2 to the arithmetic processing device 31.

The arithmetic processing device 31 has, for instance, a computer, executes a signal processing program by the computer, and operates as various processing units. In this embodiment, the arithmetic processing device 31 causes the computer to operate as a measurement control part 41 and an arithmetic part 42, and also has a nonvolatile storage device 43.

The signal processing program is stored in the storage device 43. The computer is equipped with, for instance, a CPU (Central Processing Unit), a ROM (Read Only Memory), and a RAM (Random Access Memory), and operates as the measurement control part 41 and the arithmetic part 42 by loading the signal processing program into the RAM and executing the signal processing program by the CPU.

According to a predetermined measurement sequence, the measurement control part 41 (a) controls the high frequency power supply 11 and the light emitting device 12 and (b) obtains the digitized CMR signal CMR_SIG and the digitized reference light sensor signal ref2 as mentioned above, stores them in the RAM or the storage device 43, and causes the arithmetic unit 42 to derive a measurement value of the measured field.

This measurement sequence is set according to such as a frequency of the measured field. For instance, when the measured field is an alternating current field with a relatively high frequency, a spin echo pulse sequence (such as a Hahn echo sequence) is applied as this measurement sequence. However, the measurement sequence is not limited to the above configuration. Further, for instance, when the measured field is an alternating current field with a relatively low frequency, a physical field can be measured several times in one period (cycle) of the measured field by using a Ramsey pulse sequence (that is, a measurement sequence for a direct current field) so that the measured field (an intensity, a waveform, and so on) may be specified based on these measurement results.

Figure 3:
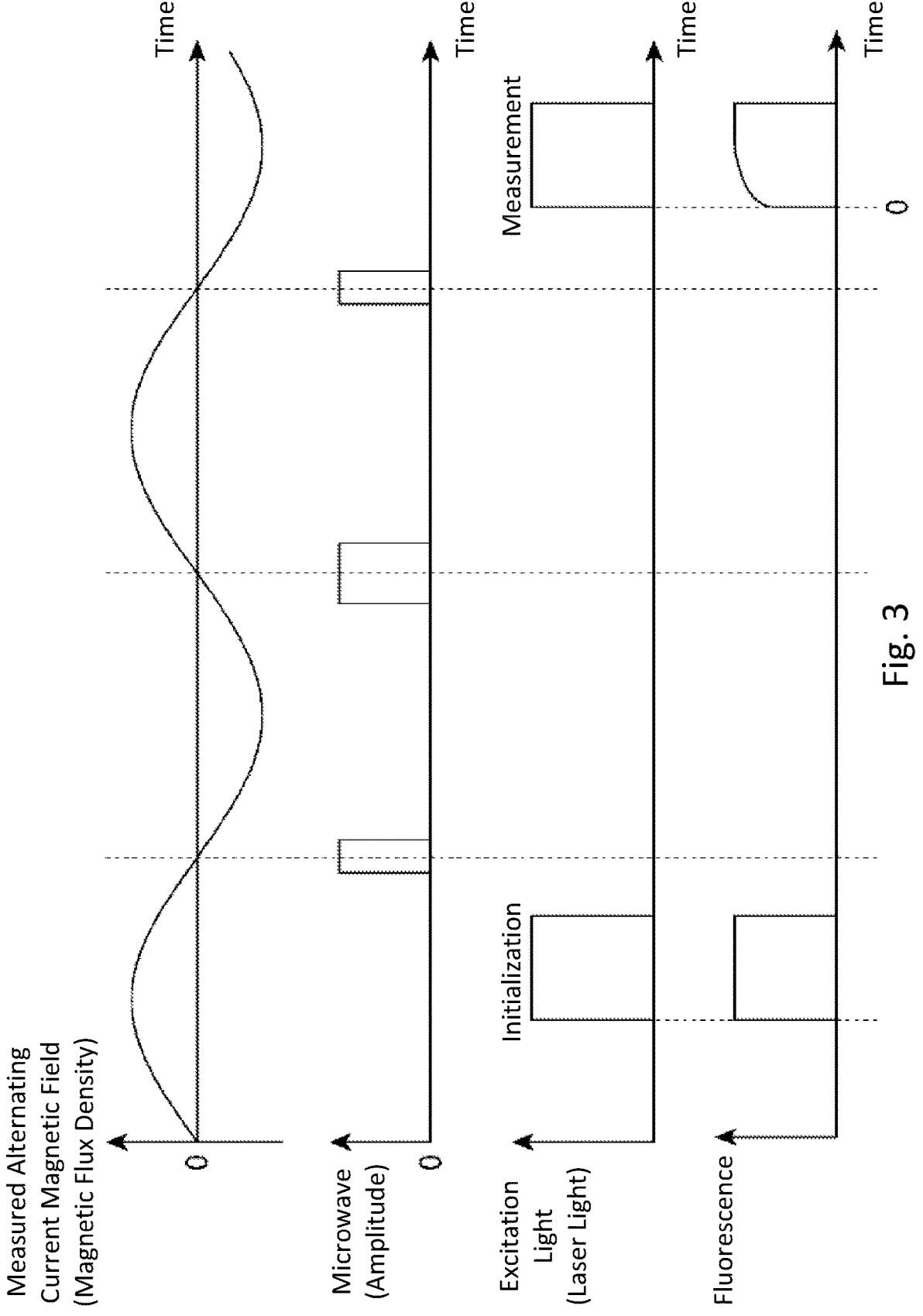
FIG. 3 is a diagram that shows an example of a measurement sequence.

FIG. 3 is a diagram that shows an example of a measurement sequence. FIG. 3 shows the timing of a microwave pulse with respect to the measured magnetic field and the irradiation timing of the excitation light (twice for initialization and measurement) in the case of a spin echo pulse sequence. As shown in FIG. 3, fluorescence is detected during the irradiation period of the excitation light.

Figure 4:
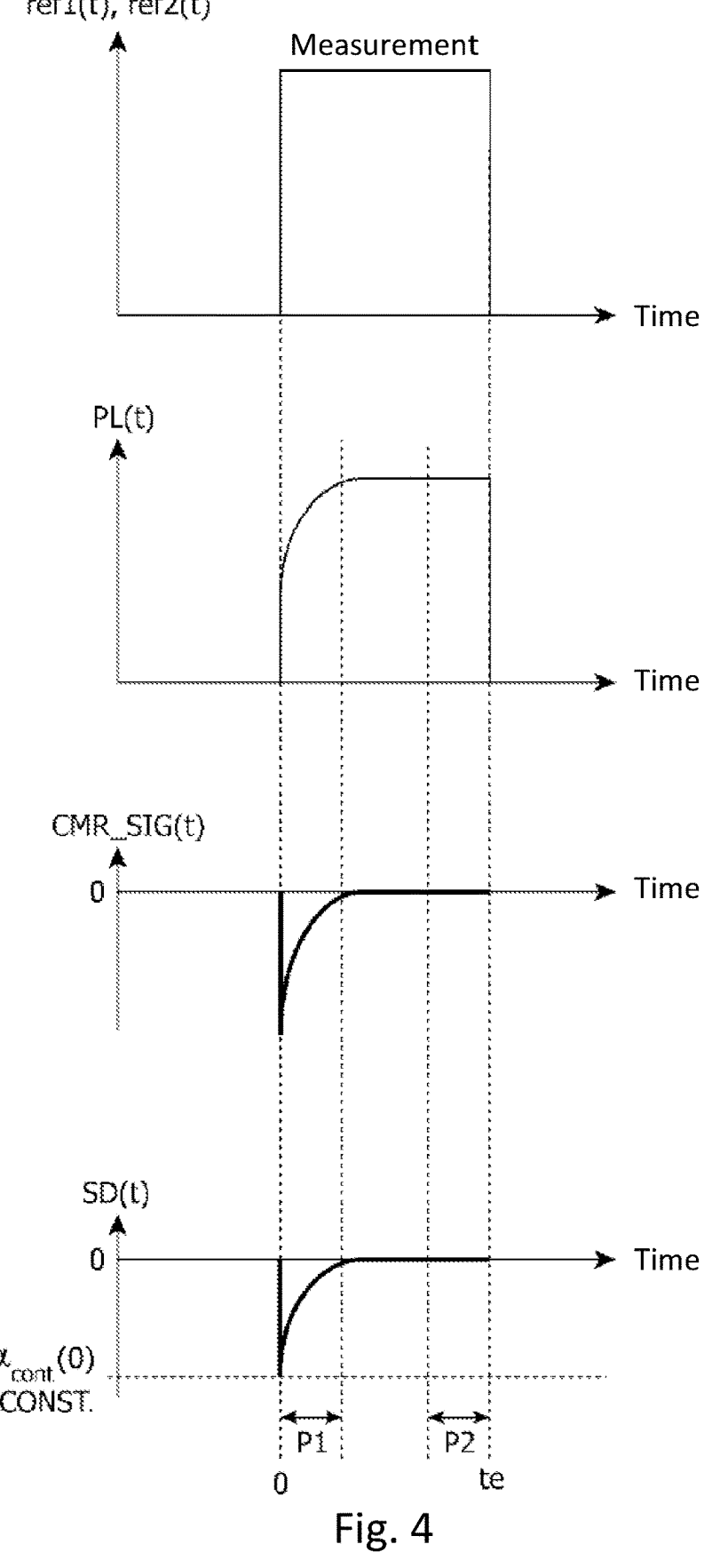
FIG. 4 is a diagram that explains reference light sensor signals ref1(t) and ref2(t), a fluorescence sensor signal PL(t), a CMR signal CMR_SIG(t), and a detection signal SD(t).

FIG. 4 is a diagram that explains the reference light sensor signals ref1(t) and ref2(t), the fluorescence sensor signal PL(t), the CMR signal CMR_SIG(t), and the detection signal SD(t).

As shown in FIG. 4, the reference light sensor signals ref1(t) and ref2(t) are substantially rectangular pulse signals during the irradiation period. The fluorescence sensor signal PL(t) becomes a pulse signal that gradually rises and converges to a constant level during the irradiation period. Further, the CMR signal CMR_SIG(t) is obtained by the common mode rejection.

Thereafter, as mentioned above, the arithmetic part 42 calculates and generates the detection signal SD(t) that is proportional to $\alpha_{cont}$ (t) from the digitized CMR signal CMR_SIG(t) and the digitized reference light sensor signal ref2(t) and derives the measurement value (that is, for instance, a magnetic flux density or a waveform of the magnetic field) of the measured field based on the detection signal SD(t).

Further, the arithmetic part 42 performs digital filter processing for noise removal with respect to the digitized CMR signal CMR_SIG(t) or the detection signal SD(t).

In this embodiment, the arithmetic part 42 applies a window function to the digitized CMR signal CMR_SIG(t) or the detection signal SD(t) in the digital filter processing and attenuates a high frequency component (a noise component with a high frequency) of the signal. The window function is an FIR (Finite Impulse Response) filter.

Figure 5:
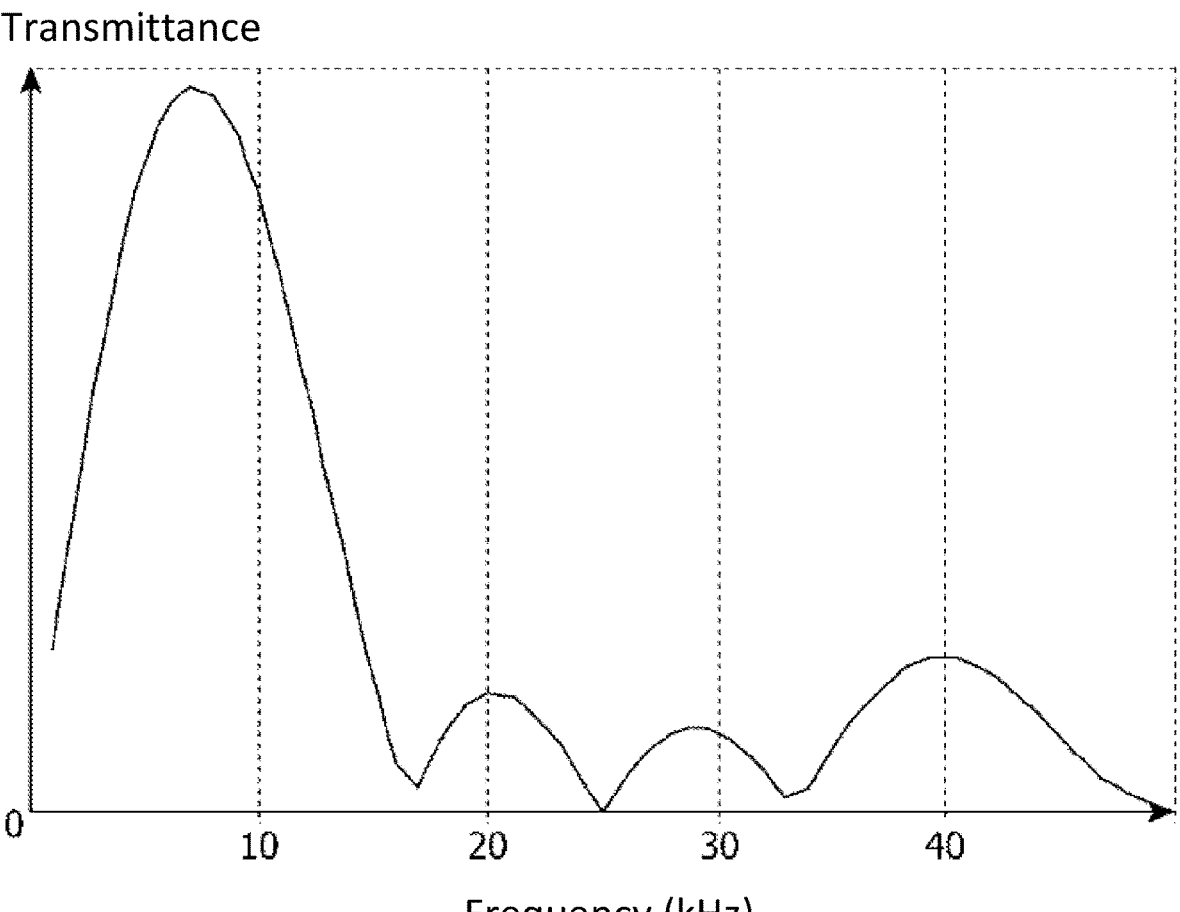
FIG. 5 is a diagram that shows an example of a frequency characteristic of a window function.

FIG. 5 is a diagram that shows an example of a frequency characteristic of the window function. The above-mentioned window function has, for instance, a frequency characteristic shown in FIG. 5 and attenuates a high frequency noise component (in this case, components of about 10 kHz or more.

Furthermore, in this embodiment, the arithmetic part 42 executes noise removal processing separately from the above-mentioned digital filter processing. In the noise removal processing, the arithmetic part 42 (a) respectively integrates (adds up) values of the digitized CMR signals that are obtained a plurality of times (with a predetermined number of samplings) at a former part (a first half) and a latter part (a second half) of the irradiation period of the excitation light, and (b) calculates a difference between an integrated value (a total sum or an average) of the CMR signals with respect to the former part and an integrated value (a total sum or an average) of the CMR signals with respect to the latter part so as to remove the noise components in the CMR signals.

For instance, as shown in FIG. 4, during a period P1 (a period of a predetermined length of time from the start time of the irradiation (t=0)) in the former part, the values of the CMR signals of a predetermined number of samplings are obtained, and during a period P2 (a period of a predetermined length of time until the end time of the irradiation (t=te)) in the latter part, the values of the CMR signals of a predetermined number of samplings are obtained. The integrated value of the latter part is subtracted from the integrated value of the former part. A value of the subtraction result is obtained. By setting the obtained value of the subtraction result as a value of the CMR signal, the noise component in the CMR signal is suppressed.

Further, in this embodiment, the analog/digital converter 26 operates faster than the analog/digital converter 27, and the analog/digital converter 27 performs digitizing with higher precision than the analog/digital converter 26.

For instance, the analog/digital converter 26 converts an input analog signal into a 20-bit digital signal at, for instance, 200M samples/sec, and the analog/digital converter 27 converts an input analog signal into a 24-bit digital signal at, for instance, 100 k samples/sec.

Further, because the CMR signal that is converted from analog to digital by the analog/digital converter 26 changes relatively quickly, the CMR signal is sampled by the high-speed analog/digital converter 26, and as mentioned above, the noise removal based on a plurality of samples (samplings) is performed. On the other hand, as mentioned above, the reference light sensor signal ref2 that is converted from analog to digital by the analog/digital converter 27 is used for the calculation in order to theoretically remove the influence of the noise component $I_{noise}$ of the excitation light in the CMR signal. Thus, it is necessary to perform the calculation with accuracy according to a relative voltage level with respect to the voltage level of the fluorescence sensor signal PL of the term of the product of the level variation $\alpha_{cont}(t)$ in the detected fluorescence sensor signal PL and the noise component intensity $I_{noise}$. Therefore, the reference light sensor signal ref2 is sampled by the analog/digital converter 27 having relatively high precision.

Figure 6:
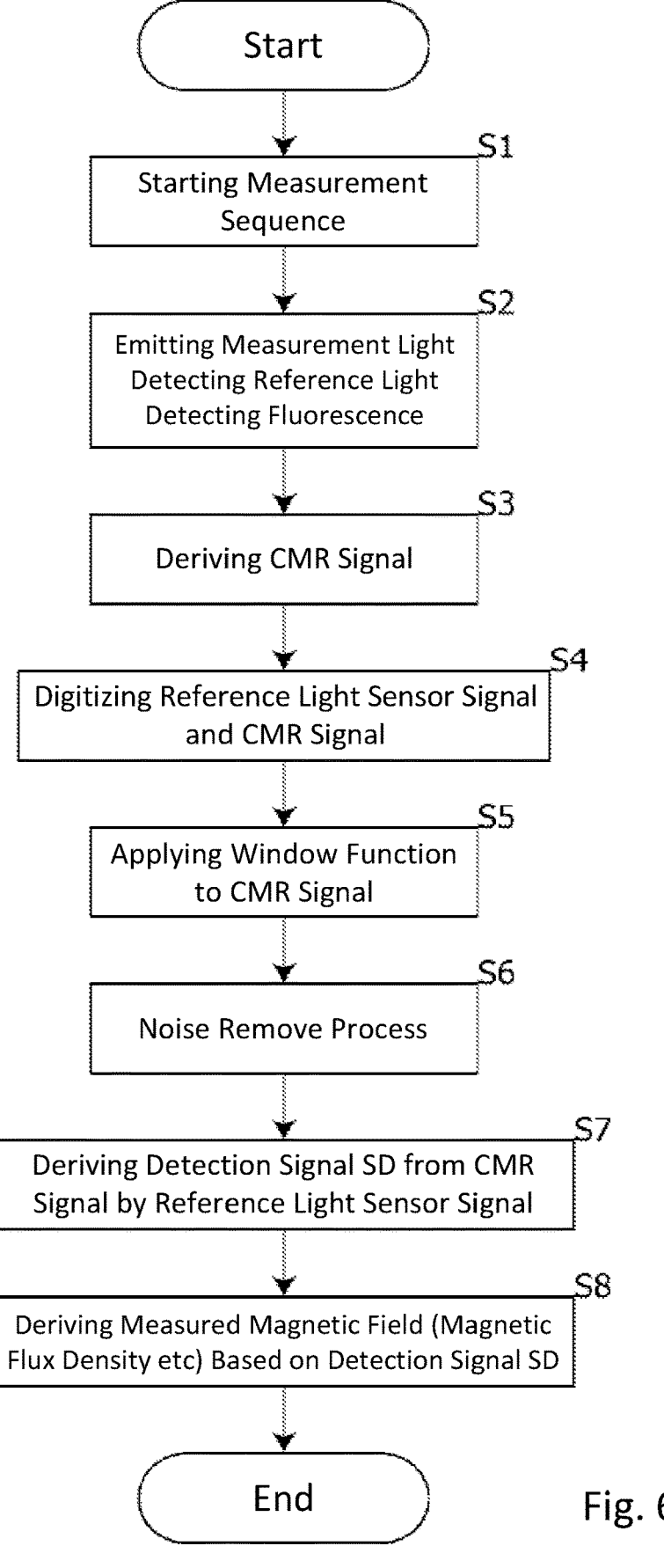
FIG. 6 is a flow diagram that explains an operation of the measurement device (that is, a measurement method) according to the embodiment shown in FIG. 1.

Next, an operation of the measurement device according to the embodiment will be explained. FIG. 6 is a flow diagram that explains the operation (that is, a measurement method) of the measurement device according to the embodiment shown in FIG. 1.

The sensor part 10 is arranged at a measurement position of the measured field. Note that measurements may be respectively performed at a plurality of measurement positions while scanning the sensor part 10.

Next, the measurement control part 41 causes the light emitting device 12 to emit the excitation light and causes the high frequency magnetic field generator 2 to transmit a microwave according to a predetermined measurement sequence (step S1).

As a result, during the irradiation period of the excitation light at the time of measurement, the light receiving device 13 outputs the fluorescence sensor signal PL (an analog signal), and the light receiving devices 23 and 24 respectively output the reference light sensor signals ref1 and ref2 (analog signals) (Step S2). Thereafter, the CMR arithmetic part 25 outputs the CMR signal CMR_SIG(t) from the fluorescence sensor signal PL(t) and the reference light sensor signal ref1, and the CMR signal CMR_SIG(t) is digitized by the analog/digital converter 26 (steps S3 and S4). On the other hand, the reference light sensor signal ref2 is digitized by the analog/digital converter 27 (step S4).

When the measurement control part 41 obtains this CMR signal CMR_SIG(t) (a digital signal) and the reference light sensor signal ref2 (a digital signal), the arithmetic part 42 removes the high frequency noise component (for instance, components of 10 kHz or more) from the CMR signal CMR_SIG(t) by applying the window function to the CMR signal (step S5), and further, performs integrations (additions) and differential actions with respect to a plurality of values of the CMR signals CMR_SIG(t) sampled several times (for instance, 1000 times) so as to remove the relatively low frequency noise component (for instance, components of several kHz to 10 kHz) (step S6).

Further, the arithmetic part 42 derives the value of the detection signal SD(t) based on the value of the CMR signal that is obtained by removing the noise as mentioned above and the value of the reference light sensor signal ref2 (step S7). From the value of the detection signal SD(t), the arithmetic part 42 derives the measurement value of the measured field at the measurement position and at the measurement timing (an execution timing of the measurement sequence) (step S7).

As mentioned above, according to the embodiment, the high frequency magnetic field generator 2 performs the electron spin quantum operation with respect to the magnetic resonance member 1 using the microwave. In the magnetic resonance member 1, the electron spin quantum state changes in correspond with the measured field and the electron spin quantum operation can be performed by using the microwave. The light emitting device 12 emits the excitation light to irradiate the magnetic resonance member 1. The light receiving device 13 receives the fluorescence that is emitted by the magnetic resonance member 1 in correspond with the excitation light and generates the fluorescence sensor signal corresponding to the intensity of the fluorescence. The CMR arithmetic part 25 performs the common mode rejection on (with respect to) the fluorescence sensor signal based on the reference light sensor signal generated by receiving the reference light that is obtained by branching the excitation light. Further, the CMR arithmetic part 25 generates the CMR signal based on the common mode rejection. The analog/digital converter 26 digitizes the CMR signal. The analog/digital converter 27 digitizes the reference light sensor signal that is generated by receiving the reference light that is obtained by branching the above-mentioned excitation light. The arithmetic processing device 31 generates the detection signal based on the digitized CMR signal and the digitized reference light sensor signal and derives the measurement value of the measured field based on the detection signal. Note that the CMR arithmetic part 25 performs the above-mentioned common mode rejection in consideration of the nonlinearity of the level of the fluorescence sensor signal with respect to the amount of the above-mentioned excitation light. Further, the arithmetic processing device 31 performs the digital filter processing for the noise removal on (with respect to) the digitized CMR signal or the detection signal.

As a result, because the noise components caused by the excitation light that is irradiated to the magnetic resonance member 1 are suppressed by the above-mentioned common mode rejection, the calculation of the detection signal using the reference light sensor signal, and the digital filter processing, the measurement accuracy is improved. Furthermore, because the nonlinearity of the level of the fluorescence sensor signal with respect to the amount of the above-mentioned excitation light is considered, the measurement accuracy is improved.

Note that various changes and modifications to the embodiments described above will be apparent to one having ordinally skill in the art. Such the changes and modifications may be made without departing from the spirit and scope of the subject matter and without diminishing the intended advantages. That is, it is intended that such the changes and modifications are included within the scope of the claims.

For instance, in the above embodiment, the magnetic field measurement is performed based on the optically detected magnetic resonance. However, for example, a temperature measurement can also be performed in the same manner. It is also possible to perform a current measurement based on the magnetic field obtained by the magnetic field measurement.

Furthermore, in the above embodiment, in separation of the reference light for the common mode rejection, the reference light for calculating the detection signal using the above-mentioned reference light sensor signal is branched from the excitation light. However, the reference light that is branched for the common mode rejection may also be used as the reference light for calculating the detection signal using the above-mentioned reference light sensor signal. Further, although the above-mentioned reference light sensor signals ref1 and ref2 are separately generated, it is also possible that one reference light sensor signal ref is generated and used as the above-mentioned reference light sensor signals ref1 and ref2.

Further, in the above embodiment, the window function is applied to the CMR signal. However, instead of applying to the CMR signal, the window function may be applied to the detection signal.

Further, in the above embodiment, the differential amplifier 25*b* may be provided in separation of the analog/digital converter 26 or may be built in the analog/digital converter 26.

INDUSTRIAL APPLICABILITY

The present invention can be applicable to, for instance, a measurement device that uses optically detected magnetic resonance.

The invention claimed is:

1. A measurement device comprising:

a magnetic resonance member in which an electron spin quantum state changes in response to a measured field and in which an electron spin quantum operation is performed by using a microwave;

a high frequency magnetic field generator that performs the electron spin quantum operation of the magnetic resonance member by using the microwave;

a light emitting device that emits excitation light to irradiate the magnetic resonance member;

a fluorescence light receiving device that receives fluorescence emitted by the magnetic resonance member in response to the excitation light and generates a fluorescence sensor signal corresponding to an intensity of the fluorescence;

a CMR arithmetic part that performs common mode rejection with respect to the fluorescence sensor signal based on a reference light sensor signal and generates a CMR signal based on the common mode rejection, the reference light sensor signal being generated by receiving reference light, the reference light being obtained by branching the excitation light;

a first analog/digital converter that digitizes the CMR signal;

a second analog/digital converter that digitizes a reference light sensor signal that is generated by receiving reference light, the reference light being obtained by branching the excitation light; and an arithmetic processing device that generates a detection signal based on the digitized CMR signal and the digitized reference light sensor signal and derives a measurement value of the measured field based on the detection signal, wherein the CMR arithmetic part performs the common mode rejection in consideration of nonlinearity of a level of the fluorescence sensor signal corresponding to an amount of the excitation light, and the arithmetic processing device performs digital filter processing for noise removal with respect to the digitized CMR signal or the detection signal.

2. A measurement method comprising:

performing an electron spin quantum operation with respect to a magnetic resonance member by using a microwave according to a predetermined measurement sequence and emitting excitation light to irradiate the magnetic resonance member, an electron spin quantum state being changed in response to a measured field and the electron spin quantum operation being performed by using the microwave in the magnetic resonance member;

receiving fluorescence emitted by the magnetic resonance member in response to the excitation light and generating a fluorescence sensor signal corresponding to an intensity of the fluorescence;

performing common mode rejection with respect to the fluorescence sensor signal based on a reference light sensor signal in consideration of nonlinearity of a level of the fluorescence sensor signal corresponding to an amount of the excitation light and generating a CMR signal based on the common mode rejection, the reference light sensor signal being generated by receiving reference light, the reference light being obtained by branching the excitation light;

digitizing the CMR signal;

digitizing a reference light sensor signal that is generated by receiving reference light, the reference light being obtained by branching the excitation light;

generating a detection signal based on the digitized CMR signal and the digitized reference light sensor signal and deriving a measurement value of the measured field based on the detection signal; and performing digital filter processing for noise removal with respect to the digitized CMR signal or the detection signal.

3. The measurement method according to claim 2, wherein the common mode rejection is performed based on the reference light sensor signal under a condition in which a level of the fluorescence sensor signal is expressed as a polynomial expression of degree N of an amount of the excitation light to generate a CMR signal based on the common mode rejection, and N is any number equal to or more than 2.

4. The measurement method according to claim 2, wherein the CMR signal is digitized by a first analog/digital converter, the reference light sensor signal is digitized by a second analog/digital converter, the first analog/digital converter operates at higher speed than the second analog/digital converter, and the second analog/digital converter digitizes with higher accuracy than the first analog/digital converter.

5. The measurement method according to claim 2, wherein the reference light sensor signal, which is digitized to be used for generation of the detection signal, is generated in separation of the reference light sensor signal that is used for the common mode rejection.

6. The measurement method according to claim 2, wherein a window function is applied with respect to the digitized CMR signal or the detection signal in the digital filter processing.

7. The measurement method according to claim 2, wherein (a) values of the digitized CMR signals, which are respectively obtained several times at a former part and a latter part of an irradiation period of the excitation light, are integrated, and (b) a difference between an integrated value of the CMR signals with respect to the former part and an integrated value of the CMR signals with respect to the latter part is calculated to remove a noise component in the CMR signal.

* * * * *